(12) United States Patent
Nayak et al.

(10) Patent No.: US 10,217,900 B2
(45) Date of Patent: Feb. 26, 2019

(54) LIGHT EMITTING DIODE STRUCTURES

(71) Applicant: GLOBALFOUNDRIES INC., Grand Cayman (KY)

(72) Inventors: Deepak K. Nayak, Union City, CA (US); Srinivasa R. Banna, San Jose, CA (US); Ajey P. Jacob, Watervliet, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/643,061

(22) Filed: Jul. 6, 2017

(65) Prior Publication Data
US 2019/0013436 A1 Jan. 10, 2019

(51) Int. Cl.
| | |
|---|---|
| *H01L 33/12* | (2010.01) |
| *H01L 33/00* | (2010.01) |
| *H01L 33/06* | (2010.01) |
| *H01L 33/32* | (2010.01) |
| *H01L 33/22* | (2010.01) |

(52) U.S. Cl.
CPC ............ *H01L 33/12* (2013.01); *H01L 33/007* (2013.01); *H01L 33/0025* (2013.01); *H01L 33/0075* (2013.01); *H01L 33/06* (2013.01); *H01L 33/22* (2013.01); *H01L 33/32* (2013.01)

(58) Field of Classification Search
None
See application file for complete search history.

(56) References Cited

U.S. PATENT DOCUMENTS

| | | | |
|---|---|---|---|
| 6,372,356 B1 * | 4/2002 | Thornton | B32B 15/01 257/189 |
| 7,612,365 B2 | 11/2009 | Clifton | |
| 9,818,872 B2 * | 11/2017 | Ching | H01L 29/7848 |
| 2014/0091360 A1 * | 4/2014 | Pillarisetty | H01L 21/8258 257/190 |

* cited by examiner

*Primary Examiner* — Bradley Smith
(74) *Attorney, Agent, or Firm* — Anthony Canale; Andrew M. Calderon; Roberts Mlotkowski Safran Cole & Calderon P.C.

(57) ABSTRACT

The present disclosure generally relates to semiconductor structures and, more particularly, to light emitting diode (LED) structures and methods of manufacture. The method includes: forming a buffer layer on a substrate, the buffer layer having at least a lattice mismatch with the substrate; and relaxing the buffer layer by pixelating the buffer layer into discrete islands, prior to formation of a quantum well.

17 Claims, 3 Drawing Sheets

LIGHT EMITTING DIODE STRUCTURES

FIELD OF THE INVENTION

The present disclosure generally relates to semiconductor structures and, more particularly, to light emitting diode (LED) structures and methods of manufacture.

BACKGROUND

Light-emitting diodes (LEDs) are used in displays for many different types of devices. The formation the LEDs is a challenge, though. For example, the use of GaN on a substrate has both a lattice mismatch and thermal coefficient of expansion (TCE) mismatch with the substrate, which can cause stresses in the structure, e.g., warping and cracks in an Si wafer. Due to the high lattice mismatch and TCE mismatch between the GaN material and the substrate (e.g., sapphire, glass, SiC, Si), defects are produced in the GaN buffer layer and subsequently in the GaN/InGaN/GaN multiple quantum wells (MQW).

More specifically, a lattice mismatch as high as 14% can exist between a GaN buffer layer and the underlying Si wafer. In addition, the TCE mismatch between the GaN LED material (e.g., GaN buffer layer) and the underlying substrate material, e.g., Si, can be at least 2×. And, due to this large lattice mismatch, a temperature ramp up can expand the GaN buffer layer about 2× more than the underlying Si material. Similarly, as the temperature ramps down, the GaN buffer layer can contract about 2× more than the underlying Si material. This mismatch will result in bowing and cracking of the GaN buffer layer and subsequently in the GaN/InGaN/GaN multiple quantum wells (MQW).

In an attempt to solve these problems, a thick layer of AlN/GaN buffer growth (e.g., on the order of 3 μm to 8 μm) has been grown on the underlying substrate, prior to the formation of the MQWs. However, it has been found that residual stress can still remain in the buffer layer, which can affect the growth of the MQW. This residual stress in the buffer layer not only creates defects in the MQW but can also change the band structure (emission color) of the MQW.

SUMMARY

In an aspect of the disclosure, a method comprises: forming a buffer layer on a substrate, the buffer layer having at least a lattice mismatch with the substrate; and relaxing the buffer layer by pixelating the buffer layer into discrete islands, prior to formation of a quantum well.

In an aspect of the disclosure, a method comprises: forming a buffer layer on a substrate, the buffer layer having a lattice mismatch and thermal coefficient of expansion mismatch with the substrate; relaxing the buffer layer by forming trenches into the buffer layer and underlying substrate to form discrete islands of the buffer layer; and forming multiple quantum wells on each of the discrete islands.

In an aspect of the disclosure, a structure comprises: a plurality of discrete islands of relaxed buffer layer separated by trenches; and forming multiple quantum wells on each of the discrete islands.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure generally relates to semiconductor structures and, more particularly, to light emitting diode (LED) structures and methods of manufacture. More specifically, the present disclosure relates to an LED structure with a high quality stress relaxed AlN/GaN buffer layer. Advantageously, by using the high quality stress relaxed AlN/GaN buffer layer, the LED structures can be devoid of cracks or other defects, and warping can be prevented in the underlying substrate, thereby increasing yields.

In embodiments, the LED structures described herein can be planar 2-D structures or 3D nanowire/nanosheet structures provided on a relaxed buffer layer, e.g., AlN/GaN buffer material. In embodiments, the LED structures can be relaxed by performing pixelization prior to the formation (growth) of the multiple quantum well (MQW). The pixelization will reduce stress in the AlN/GaN buffer material and more particularly at the interface between the buffer material and the underlying substrate. In this way, it is possible to manufacture the LED structures with minimum stress, low defects, tight spectral distribution, and high yield. For example, the defect free and stress free LED structures described herein are produced with the same multiple quantum well (MQW) quality, resulting in tight emission spectral distribution and high yield. The LED structures described herein have applications in variety of displays including, e.g., televisions, mobile devices, video games, and/or virtual/augmented/mixed reality products.

The LED structures of the present disclosure can be manufactured in a number of ways using a number of different tools. In general, though, the methodologies and tools are used to form structures with dimensions in the micrometer and nanometer scale. The methodologies, i.e., technologies, employed to manufacture the LED structures of the present disclosure have been adopted from integrated circuit (IC) technology. For example, the structures are built on wafers and are realized in films of material patterned by photolithographic processes on the top of a wafer. In particular, the fabrication of the LED structures uses three basic building blocks: (i) deposition of thin films of material on a substrate, (ii) applying a patterned mask on top of the films by photolithographic imaging, and (iii) etching the films selectively to the mask.

Figure 1:
FIG. 1 shows an incoming structure and respective fabrication processes in accordance with aspects of the present disclosure.

FIG. 1 shows an incoming structure and respective fabrication processes in accordance with aspects of the present disclosure. As shown in FIG. 1, the structure 10 includes a substrate 12 composed of, e.g., Si, SiC, sapphire or glass. A buffer layer 14 is formed on the substrate 12. In embodiments, the buffer layer 14 is a low-temperature metastable buffer layer 14 composed of AlN/GaN, which has a lattice mismatch and thermal coefficient of expansion (CTE) mismatch with the underlying substrate 12. In embodiments, the buffer layer 14 is deposited to a thickness of about 10 nm to about 200 nm and more preferably about 50 nm to about 75 nm to reduce the number of defects in this layer 14. The buffer layer 14 can be deposited using a low temperature deposition process, e.g., molecular beam epitaxy or Multi-Layer Chemical Vapor Deposition (MLCVD).

Figure 2A:
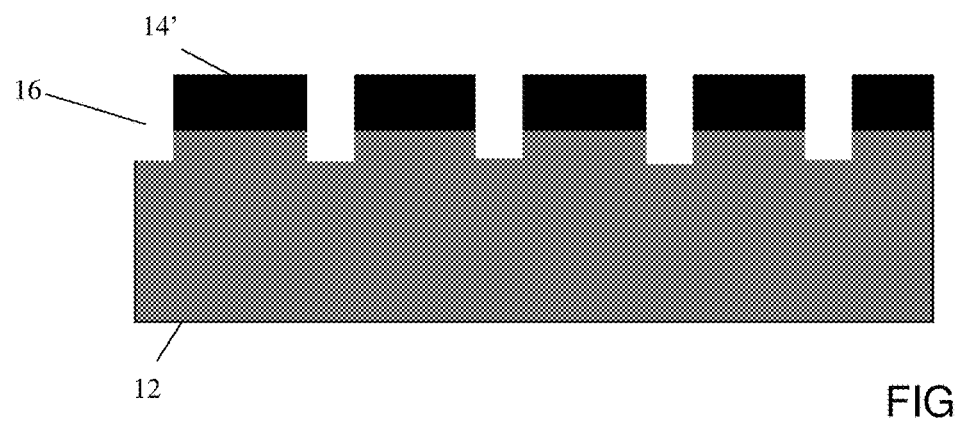
FIGS. 2A and 2B show pixelated buffer regions, amongst other features, and respective fabrication processes in accordance with aspects of the present disclosure.
Figure 2B:
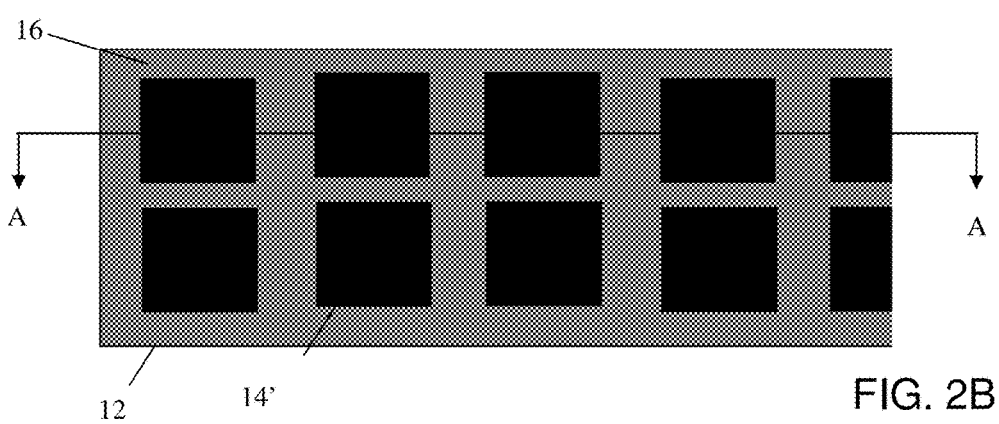

FIGS. 2A and 2B show pixelation of the low-temperature metastable buffer layer 14, amongst other features, and respective fabrication processes in accordance with aspects of the present disclosure. More specifically, FIG. 2A shows a cross-sectional view of a top plan view of FIG. 2B, along line A-A. As shown in these figures, the buffer layer 14 is pixelated (formed into discrete islands) as shown by reference numeral 14". In embodiments, the buffer layer 14 is pixelated by forming a trench 16 within the buffer layer 14 and underlying substrate 12, prior to the MQW growth. By forming the trench 16, the substrate 12 is weakened such that it can now follow the lattice structure of the buffer layer 14 during expansion and contraction. In this way, any stress in the buffer layer 14 can be relaxed via elastic stress relaxation as further described herein. In embodiments, the pixelated region 14' (e.g., discrete islands 14' of buffer layer 14) can have a length and/or width of about 0.2 µm to about 20 µm; although other dimensions are contemplated herein.

In embodiments, the trench 16 is formed by a conventional lithography and etching processes. For example, a resist formed over the buffer layer 14 is exposed to energy (light) to form a pattern (opening). An etching process with a selective chemistry, e.g., reactive ion etching (RIE), will be used to form one or more trenches 16 in the buffer layer 14 and into the substrate 12 through the openings of the resist. The resist can then be removed by a conventional oxygen ashing process or other known stripants. The depth of the trench 16 into the substrate 12 is about equal to or greater than the thickness of the buffer layer 14 and, in preferred embodiments, about 2× the thickness of the buffer layer 14. In embodiments, the trench 16 can have a depth into the substrate 12 of, e.g., about 50 nm to about 60 nm. The width of the trench 16 can be about 0.1 µm to about 4.0 µm.

Figure 3:
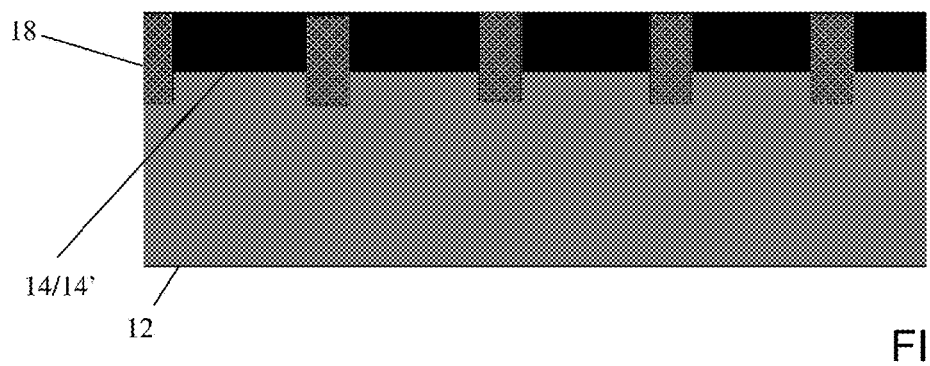
FIG. 3 shows insulator material between the pixelated buffer regions, amongst other features, and respective fabrication processes in accordance with aspects of the present disclosure.

As shown in FIG. 3, a dielectric material 18 is formed in the trenches, followed by a chemical mechanical polishing (CMP) process. The dielectric material 18 can be deposited using a conventional deposition process, e.g., CVD. In embodiments, the dielectric material 18 can be a transparent oxide layer, although any amorphous dielectric material, which softens as the temperature increases, is contemplated by the present disclosure.

As should be understood by those of skill in the art, as the temperature increases, the softened dielectric material 18 allows the relaxed buffer layer 14 to expand. Accordingly, the relaxed buffer layer 14 is allowed to freely expand and contract (at its own rate) during a change of temperature. In this way, the relaxed buffer layer 14 can following its own lattice constant, minimizing any stress (and hence defects or cracks) that may result from a lattice mismatch and/or CTE mismatch between the buffer layer 14 and the substrate 12. In addition, the dielectric material 18 will contain any defects within the separate islands 14', e.g., prevent cracks or other defects from propagating from one island to an adjacent island.

Figure 4:
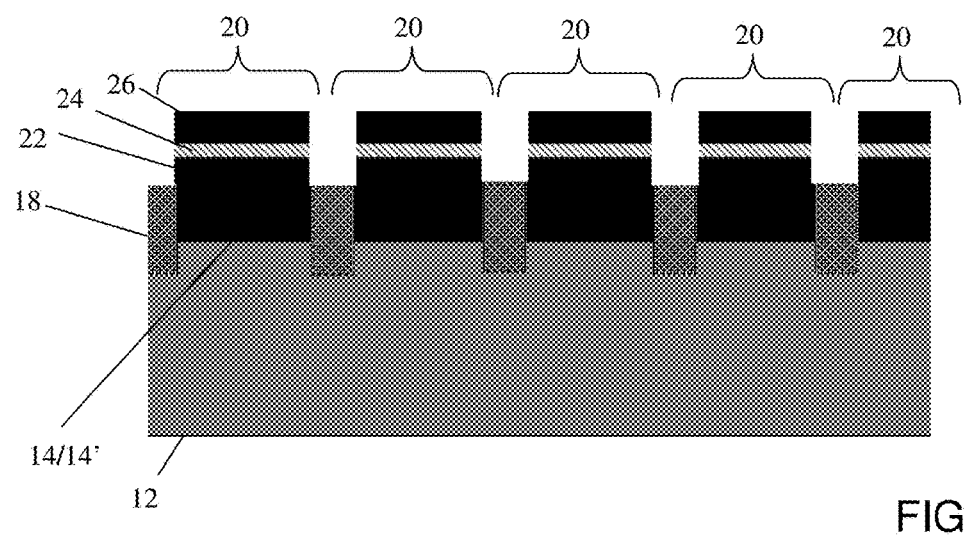
FIG. 4 shows a 2-D LED structure on the pixelated buffer regions, amongst other features, and respective fabrication processes in accordance with aspects of the present disclosure.

FIG. 4 shows a planar 2-D LED structure formed on the relaxed buffer layer 14, e.g., on each relaxed pixelated regions 14'. In embodiments, the planar 2-D LED structures 20 can be fabricated by deposition of alternating LED material using an epitaxial growth process. For example, an n-type GaN layer 22 is grown on the buffer layer 14 (e.g., of the pixelated region 14'), followed by multiple quantum wells 24, e.g., 4 to 6 wells, grown on the n-type GaN layer 22. In embodiments, the quantum wells 24 can be composed of alternating layers of GaN/InGaN/GaN. A p-type GaN layer 26 is formed on the uppermost quantum well 24.

Figure 5:
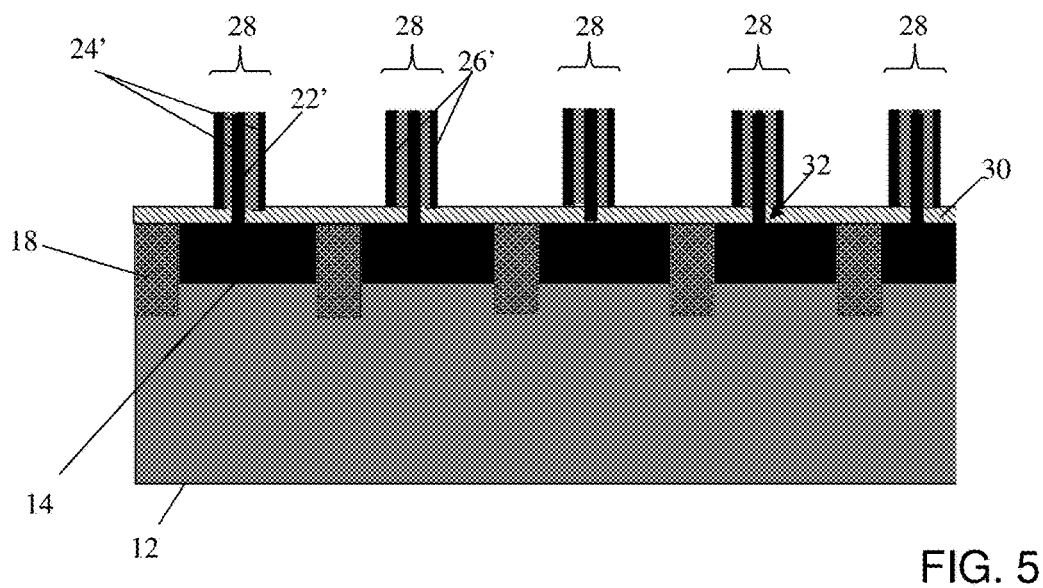
FIG. 5 shows LED nanowires or nanosheets on the pixelated buffer regions, amongst other features, and respective fabrication processes in accordance with aspects of the present disclosure.

FIG. 5 shows nanowire or nanosheet LED structures 28 formed on the relaxed buffer layer 14, e.g., on each of the relaxed pixelated regions 14'. More specifically, the nanowire or nanosheet LED structures 28 are fabricated directly on an insulator layer 30 composed of, e.g., SiN and/or $SiO_2$, deposited directly over each of the pixelated regions 14'. The insulator layer 30 can be deposited to a thickness of about 20 nm to about 70 nm, although other dimensions are contemplated herein. In embodiments, an opening 32 is formed in the insulator layer 30 using conventional lithography and etching processes, as described herein. An n-type GaN layer 22' (e.g., core of the LED structure) is grown on the buffer layer 14 (e.g., of the pixelated region 14'), though the opening 32. Multiple quantum wells 24', e.g., 4 to 6 wells, are grown on opposing sides of the n-type GaN layer 22, followed by p-type GaN layer 26' grown on the quantum wells 24'. In embodiments, the nanowire or nanosheet LED structures 28 can be about 3 µm in height and more preferably about 1 µm to 2 µm in height.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method, comprising:
    forming a buffer layer on a substrate, the buffer layer having at least a lattice mismatch with the substrate; and
    relaxing the buffer layer by pixelating the buffer layer into discrete islands, prior to formation of a quantum well, wherein the buffer layer is a metastable buffer layer of AlN/GaN.

2. The method of claim 1, wherein the substrate is one of Si, SiC, sapphire and glass.

3. The method of claim 2, wherein the pixelating of the buffer layer comprises forming a plurality of trenches within the buffer layer and into the substrate to form the discrete islands.

4. The method of claim 3, further comprising forming an amorphous material within the plurality of trenches.

5. The method of claim 4, wherein the amorphous material is an insulator material.

6. The method of claim 4, wherein the plurality of trenches have a depth into the substrate of about equal to or greater than a thickness of the buffer layer.

7. The method of claim 6, wherein the plurality of trenches have a depth into the substrate of about 2× the thickness of the buffer layer.

8. The method of claim 4, further comprising, upon a temperature change, allowing expansion of the buffer layer of each discrete island into an area of the amorphous material.

9. The method of claim 1, wherein the quantum well is multiple quantum wells formed on the discrete islands of the buffer layer to form a planar 2-D LED structure.

10. The method of claim 1, wherein the quantum well is multiple quantum wells formed on the discrete islands of the buffer layer to form nanowire or nano sheet LED structures.

11. A method comprising:
forming a buffer layer on a substrate, the buffer layer having a lattice mismatch and thermal coefficient of expansion mismatch with the substrate;
relaxing the buffer layer by forming trenches into the buffer layer and underlying substrate to form discrete islands of the buffer layer; and
forming multiple quantum wells on each of the discrete islands,
wherein the buffer layer is AlN/GaN and the substrate is one of Si, SiC, sapphire and glass.

12. The method of claim 11, further comprising forming an amorphous material within the trenches.

13. The method of claim 12, wherein the trenches have a depth into the substrate of about equal to or greater than a thickness of the buffer layer.

14. The method of claim 12, further comprising, upon a temperature change, allowing expansion of the buffer layer of each discrete island into an area of the amorphous material, which is softened upon an increase in temperature.

15. The method of claim 11, wherein the quantum well is multiple quantum wells formed on the discrete islands of the buffer layer to form a planar 2-D LED structure.

16. The method of claim 11, wherein the quantum well is multiple quantum wells formed on the discrete islands of the buffer layer to form a planar nanowire or nanosheet LED structures.

17. The method of claim 11, wherein the quantum well is formed on a core, formed through an opening of an insulator layer formed on the discrete islands of the buffer layer, and the multiple quantum wells are formed on the core to form the nanowire or nanosheet LED structures.

* * * * *